United States Patent [19]
Masson

[11] 3,944,973
[45] Mar. 16, 1976

[54] ERROR SYNDROME AND CORRECTION CODE FORMING DEVICES

[75] Inventor: Jean-Jacques Masson, Argenteuil, France

[73] Assignee: Compagnie Internationale Pour L'Informatique, Louveciennes, France

[22] Filed: Jan. 6, 1975

[21] Appl. No.: 538,937

[30] Foreign Application Priority Data
Feb. 19, 1974 France .............................. 74.05468

[52] U.S. Cl. ...................................... 340/146.1 AL
[51] Int. Cl.² ..................... H04L 1/10; G06F 11/10
[58] Field of Search .......................... 340/146.1 AL

[56] References Cited
UNITED STATES PATENTS
3,474,413  10/1969  Dryden ..................... 340/146.1 AL Primary Examiner—R. Stephen Dildine, Jr.
Attorney, Agent, or Firm—Kemon, Palmer & Estabrook

[57] ABSTRACT

In information handling systems, syndrome and correction codes adapted for error signalling and correcting operations are obtained by processing words each made of a definite number of bytes, each byte having a same number of bits and one of the bytes being comprised of the parity incoming bits of the other bytes. An error syndrome and correction code forming device is described which comprises first and second stages of modulo-2 adders (i.e. exclusive-OR circuits), the number of adders in the second stage being equal to the number of bits in the required code, wherein the adders of the first stage form the parity check bits of the bytes and further bits from selective combinations of bits in the word and wherein the bits outputting the adders of the first stage are distributed, together with further bits of the word, to the inputs of the adders of the second stage. Substantially all the adders of the first stage have at least as many inputs as there are information bytes in the word to be processed and substantially all the outputs of said first stage adders are applied to inputs of at least two adders of the second stage.

5 Claims, 8 Drawing Figures

ERROR SYNDROME AND CORRECTION CODE FORMING DEVICES

BRIEF SUMMARY OF THE INVENTION

The present invention concerns improvements in or relating to error syndrome and correction code forming devices for information handling systems wherein each word is made of a plurality of bytes, each byte comprises a same number of bits and byte parity bits are either comprised in or simultaneously available to the word.

Error syndrome and correction codes are mainly used for store record and fetch operations. They are used for signalling errors and for an automatic correction of at least single errors in the words.

In any location in an information handling system, the parities of the bytes and even the parities of the words must preferably be known and, from time to time or place to place, such information must be checked. This is the case at locations where error syndrome and correction codes are to be generated.

The generation of parity check bits and of error syndrome and correction code bits is obtained, as is commonly known, from execution of modulo-2 additions, i.e. exclusive-OR operations, with the concerned bits, i.e. the bits of a byte for a byte parity check, the parity bits of the bytes for a word parity check, and, for the error code bits, bits which are selected in the word in accordance with the configuration of a matrix defining the error code. A well-known kind of such error syndrome and correction code is the HAMMING one.

An important problem in the error syndrome and correction code generation is to process the bits of the word with a minimal amount of hardware and it is an object of the invention so to provide such a code forming device as to reach an minimum hardware in terms of modulo-2 adders each having available inputs of a number at least equal to the number of bits in a byte.

According to a feature of the invention, an error syndrome and correction code forming device comprises two stages of modulo-2 adders each having available inputs of a number at least equal to the number of bits in a byte of the word to be processed, the second stage comprising as many modulo-2 adders as there are bits in the code to be formed. The first stage is comprised of adders generating the byte parity bits and of adders operating on selected bits from the word for generating bits representative of subcombinations of the final code. The bit outputs from the first stage are selectively distributed to inputs of the adders of the second stage together with further bits from the word to be processed as either implementing or correcting bits in the said second stage adders.

BRIEF DESCRIPTION OF THE DRAWINGS

The invention will be described in full detail with reference to the accompanying drawings, wherein.

Figure 7:
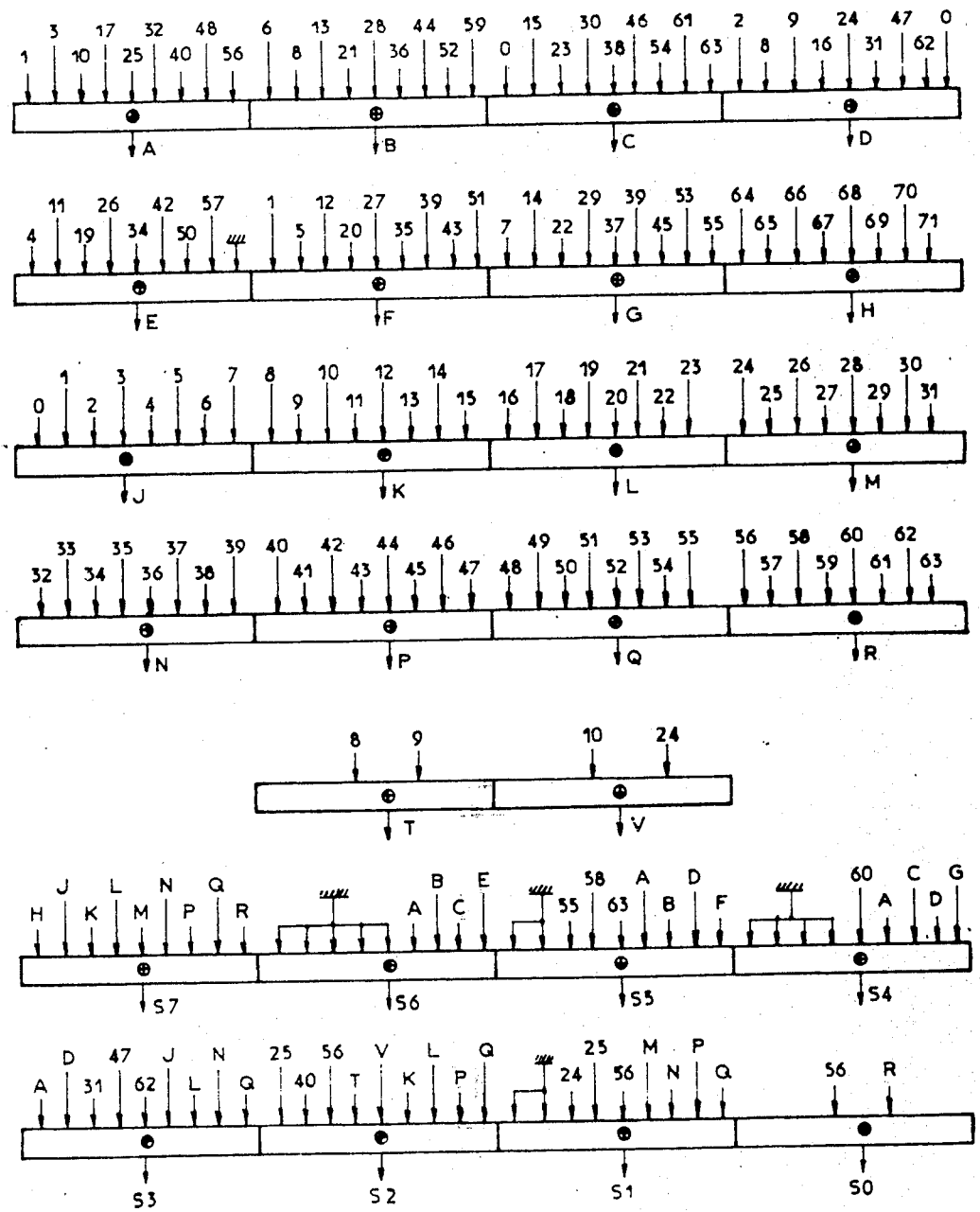
Figure 8:
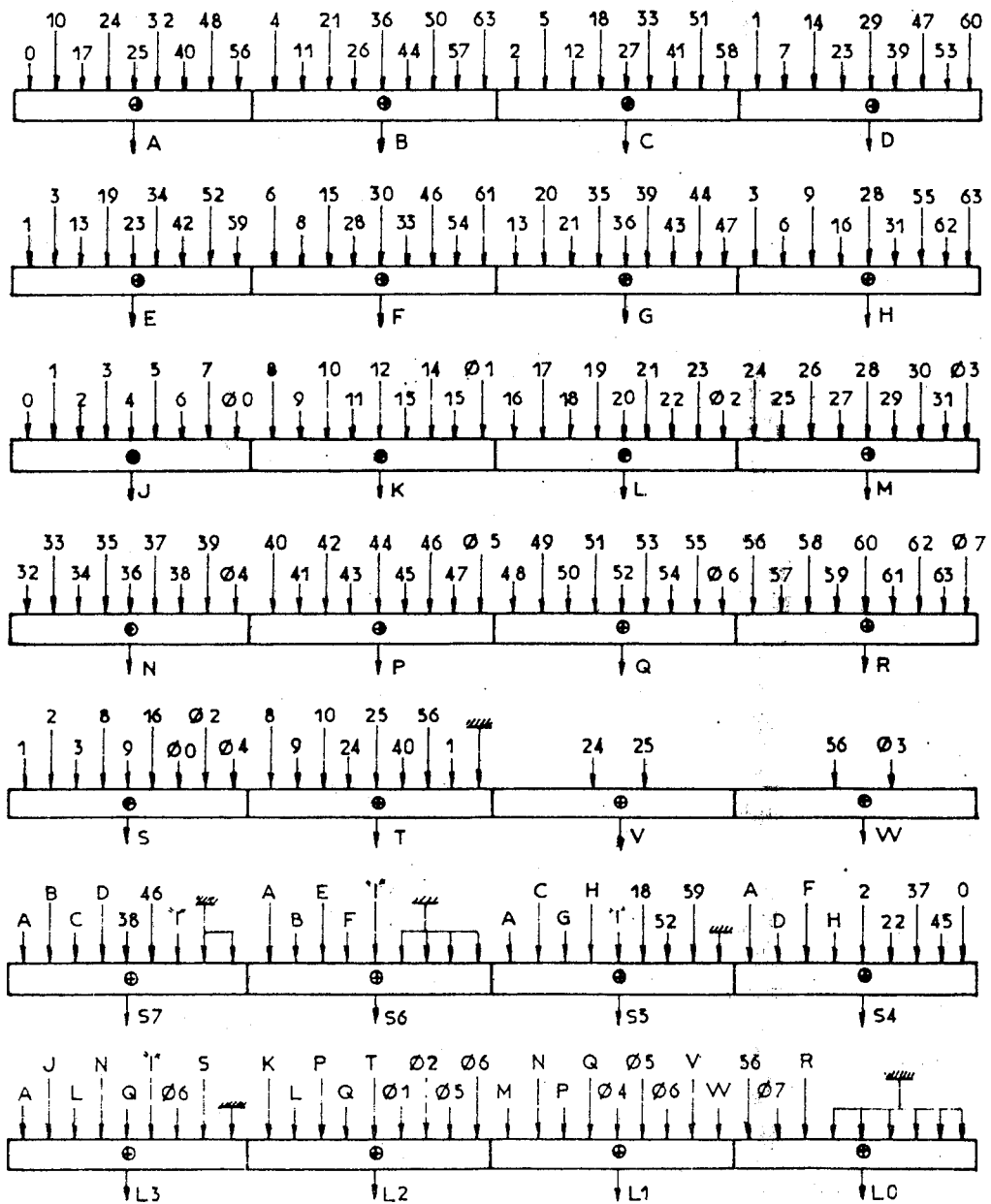

The examples of embodiment of FIGS. 7 and 8 are solely illustrative and any modification thereof will remain within the scope and field of the invention.

DETAILED DESCRIPTION

The invention will be described for the particular case where the word is made of eight octet bytes, i.e. bytes of eight bits, plus a parity byte for the word, made of eight byte parity bits. Of course the parity bits may be distributed throughout the word or come from circuits external to the source of the word but simultaneously available to said word.

Figure 1:
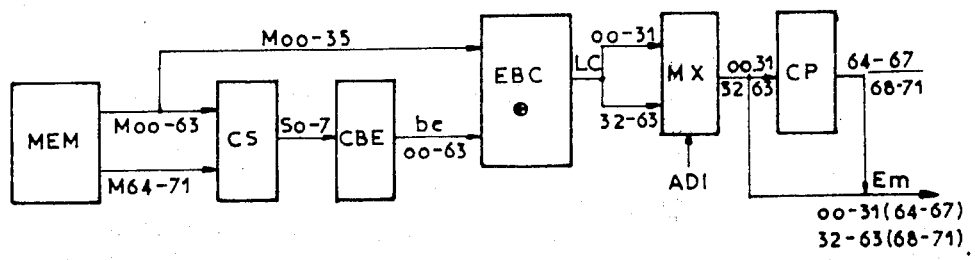
FIG. 1 shows in block form a prior art equipment formerly adapted to parity check and error signalling and detecting codes in a read-out organization of a data store.
Figure 2:
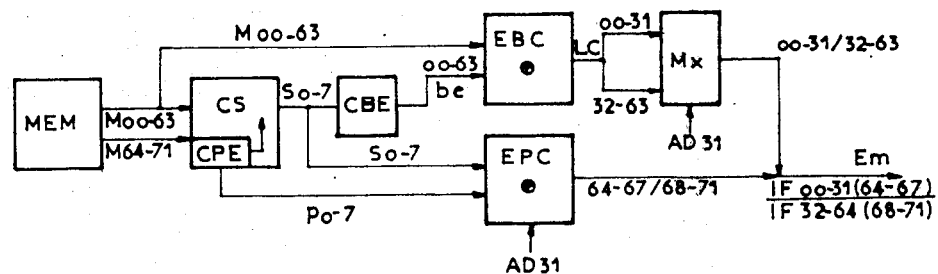
FIG. 2 shows, in contradistinction to FIG. 1, the equivalent equipment embodying an error syndrome code forming device according to the present invention.

FIGS. 1 and 2 concern equipment for reading words from a store MEM. Each data word issues from MEM as two codes, Moo-63, representing a sixty-three bit information, and M64–64-representing an octet made of the byte parity bits of the eight octets of the information. These two codes must be sent to a requester party from the output Em, after having been checked and, when possible, corrected. The shown example concerns a most common case wherein the requester only accepts four octet words, each with its parity bit quartet. Under this condition, a multiplexer circuit Mx is shown for reaching the output Em. "Half-words" alternately issue from said multiplexer circuit together with the parity bit quartets of their own, from an output of a parity bit forming circuit CP. The control of the multiplexer circuit Mx is provided by an input AD1 which switches the inputs of the multiplexer from its input 00–31 to its input 32–63 on the incoming LC link, from a buffer EBC wherein, at each operation, a complete word is stored.

In a conventional organization, FIG. 1, the code which is read-out from MEM is applied to an error syndrome code forming circuit CS. The issuing eight-bit code So-7 is applied to a circuit CBE which decodes it and defines, when there is an error, what is the rank, from 00 to 63, of the bit which is in error. From the said bit rank $bc$, the buffer EBC is controlled for correction if a single bit is in error. Such a correction may be made, as known, as follows: the erroneous bit is operated in an exclusive-OR circuit receiving 1 on its other input: when the bit value ought to be 0, the operation converts it into 1 and vice-versa.

The casually corrected code is applied through Mx half-word per half-word to the output Em but is also applied to a circuit CP which forms the parity bits of the bytes in said half-words and the output of which is also connected to Em.

This equipment does not check the inputting parity bits. As the computation of the error syndrome and correction code in CS takes into account such incoming parity bits, CS may, obviously, produce erroneous corrections when these parity incoming bits are in error.

On the other hand, FIG. 2, with an error syndrome and correction code forming circuit according to the invention, CS, the actual byte parity bits are generated at CPE within CS so that such true parity bits Po-7 are available for a parity code correcting and buffering circuit EPC paralleled with the correcting and buffering circuit EBC of the information part of the word. The syndrome bits So-7 are applied both to EPC and to the CBE circuit wherein the rank of any bit in error in the information part of the word, is detected. The circuit CP of FIG. 1 is of course omitted in FIG. 2.

Figure 3:
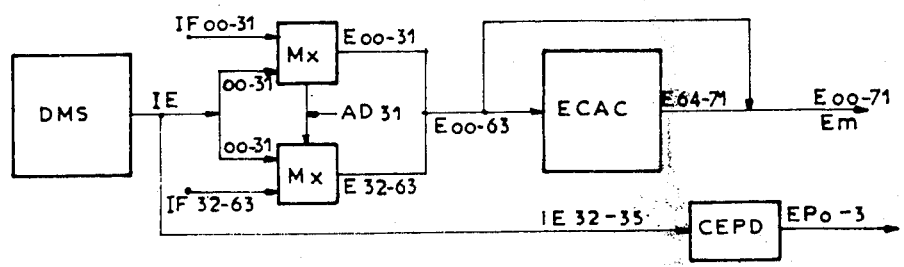
FIG. 3 shows in block form a prior art equipment formerly adapted to parity check and error signalling and detecting codes in a write-in organization of a data store.

FIG. 3 shows a prior art equipment for handling words to be recorded in a store connected to the E*m* output of the equipment. It comprises a circuit ECAC which generates an auto-correction code, i.e. an error syndrome code which is differently used here. The input of ECAC receives a sixty-four digit word obtained from the concatenation of a thirty-two digit word, 00–31 read-out from a record requesting circuit DMA including buffer means for said thirty-two digit word, plus a parity bit quartet thereof, and the one or the other of two "half-words" IF 00–31 and IF 32–63. Said concatenation is made through two multiplexer circuits Mx alternatively controlled from a command AD31 reverting the conditions of the multiplexer circuits, which always are in reverse or opposite conditions of conduction. A logical-OR operation on the outputs of the two multiplexers Mx consequently gives the complete word code E 00–63, to ECAC, which delivers the correction code E64–71 to the output Em. Concomitantly, from the output IE of DMS, the parity bit quartet IE 32–35 issuing from DMS is applied to a circuit CEPD which checks the said parity bit quartet and issues casually amended parity bits EPO-3, independantly of the ECAC circuit. Said ECAC circuit may consequently operate with erroneous parity bits.

Figure 4:
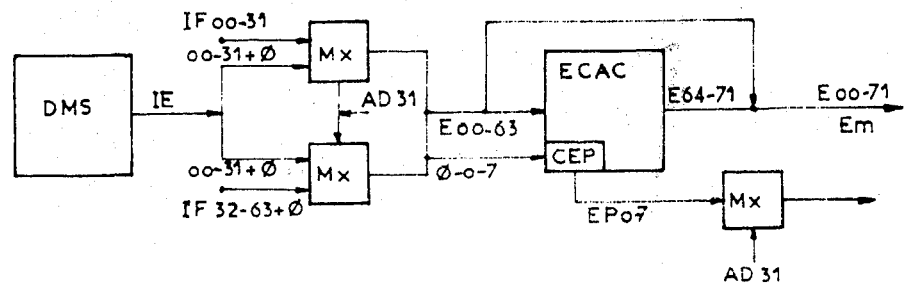
FIG. 4 shows, in contradistinction with FIG. 3, the equivalent equipment embodying an error syndrome and correcting code forming device according to the present invention, FIGS. 5 and 6 illustratively show Hamming code matrices for the generation of syndrome and error correction codes, which are of particular advantage for putting the present invention into actual practice, and, FIGS. 7 and 8 respectively show structures of devices according to the invention operating according to the matrices of FIGS. 5 and 6.

On the other hand, in an equipment according to the invention as shown in FIG. 4, the ECAC circuit internally comprises means CEP for generating checked parity bits EPO-7 from both quartets of parity digits from IE and from IF. Said eight bits are referred $\phi$0–7. The checked parity bits may, when required, be separately fetched through a multiplexer Mx, quartet by quartet, as shown.

For a write-in operation, the syndrome bits are concatenated as bits 64 to 71 to the outputting word information code. Such bits therefrom will be referred to as L0 to L7.

Figures 5, 6:
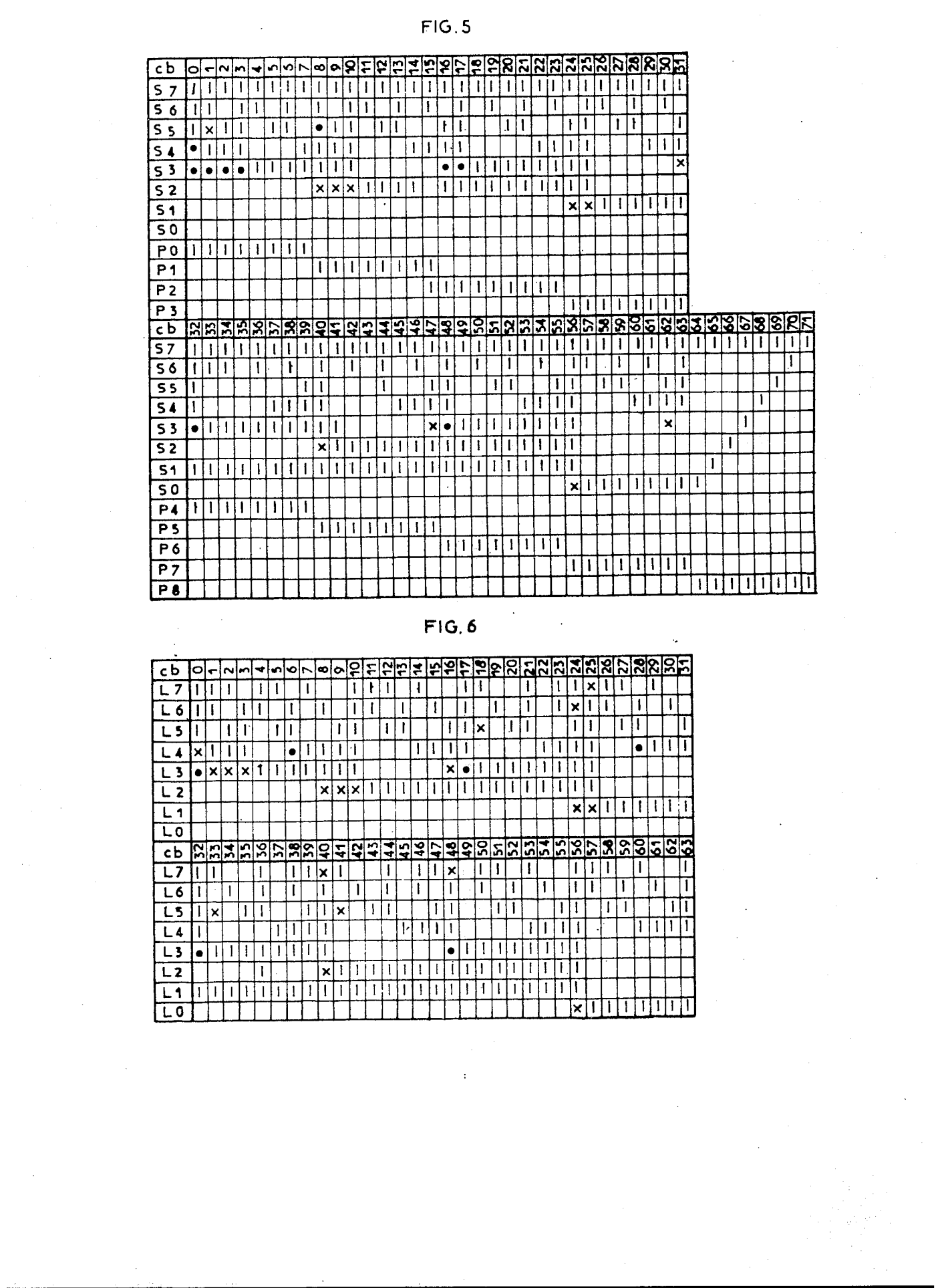

The present invention concerns the formation of error syndrome and correction codes which, as described with relation to FIGS. 2 and 4, involve an imperative recourse to parity check bit generation. FIG. 5 shows a Hamming code matrix subtending the generation of a syndrome code for store read-out whereas FIG. 6, also shows a Hamming code matrix subtending the generation of a correcting code for store writein. Said figures show the combinations of bits of the input word to ensure generation of the error syndrome bits S0 to S7, FIG. 5 and of the error correcting bits L0 to L7, FIG. 6. FIG. 5 also shows the generation of the parity check bits, omitted in FIG. 6 as being identical to those of FIG. 5.

Each combination of bits from the incoming word to process requests, resulting in a bit of the error code, involves a modulo-2 addition of a plurality of bits. Apart from the S0 and L0 bits, none of the other bits of the codes can be obtained from a single "tool" or circuit. If each one of the said combinations was separately made, a considerable amount of electronic hardware would be needed. It has already been proposed to proceed from selective subcombinations of the digits from the word in cascaded connected adder stages. In such devices however, the selective subcombinations were systematically chosen with the aim of imperatively utilizing all the bits of the word in the first stage of adders. Such inflexibility could not enable an actual optimalization of the subcombinations. Further, each adder had a number of inputs which was restricted with respect to the number of bits in a byte, so that at least two stages were necessary for obtaining, for instance, the parity check bits, so that three stages or more of adders were finally imperative.

In contradistinction, the invention provides use of adders having each an input capacity of at least the number of bits in a byte and provides use of selectively chosen digits, or bits, in the word to be selectively introduced in the second one of the two stages which comprised the device, either as complement bits or as bits correcting certain of the subcombinations generated by adders of the first stage.

The choice of the subcombinations which are operated in the first stage adders follows the rule that, as far as possible, the subcombinations may enter into several combinations in the adders of the second and final stage. For accentuating this feature, it is provided that in certain of the combinations of the first stage, bits are introduced which are expletive in some of the final combinations in which such first stage subcombinations will be parts and to provide introduction in the adders of the second stage receiving such expletive bit subcombinations of correcting bits, which are identical to the said expletive bits of the first stage subcombinations since, as known the result of an exclusive-OR operation between X and X (identical bit values) is zero. In FIGS. 5 and 6, such bits which are introduced as expletive in first stage subcombinations and thereafter reintroduced as correcting bits in the final combinations are marked (*x*) in the matrices.

In order to further reinforce the above defined feature, and consequently aim a further restricted number of adders in the first stage, it is provided to introduce into certain first stage subcombinations, expletive bits which, in the final combinations in the second stage will automatically be corrected because the same "expletive" bit is a part of another subcombination which, in the final combination, is used simultaneously to the first expletive bit subcombinations. Such self-correcting expletive bits are marked (.) in the matrices of FIGS. 5 and 6. In said matrices, as usual, all the other present bits are marked 1.

FIGS. 7 and 8 illustratively show two examples of the possible circuitry for devices embodying the above defined features, plus an additional one, i.e. a few first stage subcombinations are made for a single final combination (the T and V adders in said FIGS. 7 and 8, each of a reduced number of input bits, i.e. two).

The device of FIG. 7 comprises eighteen first stage adders of the modulo-2 kind and, of course, eight modulo-2 adders for the second stage as it is assumed that a word comprises eight bytes of eight bits and an error code also comprises eight bits.

In FIG. 7, the modulo-2 adders J, K, L, M, N, P, Q, R generate the parity check bits of the eight information bytes of the word. A further adder generates, at H, the parity check bit of the complete word, deduced from the parity bits of the word. The input bits for such adders are obvious per themselves.

Each adder in both FIGS. 7 and 8 are to be understood as uniformly being nine input modulo-2 adders, which is a current specification for such devices in the technical and commercial present art of informatics. Unshown inputs are unconnected.

A first subcombination A for the final combinations delivering the syndrome bits S6, S5, S4 and S3 results from the addition of word bits Nos. 1 — 3 — 10 — 17 — 25 — 32 — 40 — 48 — 56.

A second sub-combination B for the final combinations delivering the syndrome bits S6 and S5, results from the modulo-2 addition of the word bits 6 — 8 — 13 — 21 — 28 — 36 — 44 — 52 — 59.

A third subcombination C for the final combinations delivering the syndrome bits S6 and S4 results from the modulo-2 addition of the word bits Nos. 0 — 15 — 23 — 30 — 38 — 46 — 54 — 61 — 63.

A fourth subcombination D for the final combinations delivering the syndrome bits S5, S4 and S3, results from the modulo-2 addition of the word bits Nos. 0 — 2 — 8 — 9 — K6 — 24 — 31 — 47 — 62.

A fifth combination E for the final combination delivering the syndrome bit S6, results from the addition modulo-2 of the word bits, cb, Nos. 4 — 11 — 19 — 26 — 34 — 42 — 50 — 57.

A sixth subcombination F for the final combination delivering the syndrome bit S5 results from the addition modulo-2 of the word bits Nos. 1 — 5 — 12 — 20 — 27 — 35 — 39 — 43 — 51.

A seventh subcombination G for the final combination delivering the syndrome bit S4, results from the modulo-2 addition of the word bits Nos. 7 — 14 — 22 — 29 — 37 — 39 — 45 — 53 — 55.

Finally, two further two bit modulo-2 additions are made in adders T and V. The T subcombination results from the bits Nos. 8 and 9 of the word. The V subcombination results from the the bits 10 and 24.

In the second stage of the device shown in FIG. 7, the bits S7 to S0 of the syndrome code are made as follows:

The S7 bit results from the modulo-2 addition of the subcombinations H, J, K, L, M, N, P, Q and R, i.e. of all the parity check bits of the incoming bytes, including the byte constituted of the incoming parity bits.

The syndrome bit S6 results from the modulo-2 addition of the subcombinations A, B, C and E.

The syndrome bit S5 results from the modulo-2 addition of the subcombinations A, B, D and F, and of the bits 53, 58 and 63 which do not exist in the said subcombinations.

The syndrome bit S4 results from the modulo-2 addition of the subcombinations A, C, D and G and of the bit No. 60 which does not exist in said subcombinations.

The syndrome bit S3 results from the modulo-2 addition of the subcombinations A, B and J, L, N, Q and the bit No. 31 for compensation of the bit 31 of the subcombination D, which is expletive for the S3 syndrome bit, and of the bits 47 and 62, for compensation of the corresponding "expletive" bits of the said subcombination D.

The syndrome bit S2 results from the modulo-2 addition of the subcombinations T, V, L, P, Q and of the bits Nos. 25, 40 and 56. The bit No. 25 is a "true" addition as it does not appear in the subcombinations. So is the bit No. 56. On the other hand, bit No.40 is compensating the bit No. 40 of the subcombination P, expletive for the retention of S2.

The syndrome bit S1 results from the modulo-2 addition of the subcombinations M, N, P, Q and of the bits Nos. 24, 25 and 56. Bits Nos. 24 and 25 are compensating or corrective bits of the subcombination M and the bit No. 56 compensates or corrects an expletive bit of the subcombination Q.

The syndrome bit S0 results from the modulo-2 addition of the subcombination R and of the compensating bit No. 56.

It must be noted that, in the generation of the syndrome bit S3, the introduction of the subcombination J compensates the expletive bits Nos. 1 and 3 of the subcombination A and the expletive bits Nos. 0 and 2 of the subcombination D. The subcombination L compensates the expletive bits Nos. 17 and 16 of the A and D subcombinations. The subcombinations N and Q compensate the expletive bits 32 and 48 of the subcombination A. As said, an expletive bit is a bit which does not normally enter in the combination of a syndrome bit.

Similarly, in the syndrome bit S5, the bit No. 8 is expletive. As said bit appears in both the subcombinations B and D, the compensation is automatically effected.

In some adders of the second stage of the device, some inputs are shown connected to the ground, instead of being merely left unconnected. This is a purely technological fact, not within the principles of the subcombinations.

In the device shown in FIG. 8, some inputs are, for the same technological purpose, connected to the ground. Some other inputs are marked 1: this merely indicate that the output bit will be obtained in the form of a one's complement of its actual binary value. It seems superfluous to detail the device of FIG. 8 which is made similarly to the device of FIG. 7 but with respect to the Hamming matrix of FIG. 6. It must however be noted that, in the modulo-2 adders forming the parity check bits, from J to R, one of the inputs receives the corresponding rank bit $\phi$, from $\phi 0$ to $\phi 7$, of the inputting parity bits appearing in the two concatenated half-words of FIG. 4.

What is claimed is:

1. A device generating the bits of an error syndrome and correction code according to a matrix which defines for each of such bits an appropriate exclusive-or combination of bits in an incoming multi-byte word to process including a parity bit for each byte further to the bits of said bytes, comprising the combination of:
    first and second stages of modulo-2 adders, each of a number of available bit inputs at least equal to the number of bits in a byte of the word,
    the number of the adders of the second stage being equal to the number of bits in the error syndrome and correction code, each adder of the first stage generating a bit representing an exclusive-or subcombination of bits of the word to be applied to an input of at least one of the adders of the second stage, adders of the first stage generating the parity check bits of the bytes of the word,
    each adder of said second stage receiving a selection of subcombinations from the outputs of adders of said first stage,
    at least some of the adders of said second stage additionally receiving selected bits of the word.
2. Device according to claim 1, wherein adders of said first stage, the outputs of which are each connected to inputs of more than one adder of said second stage, receive word bits which in the subcombinations thus generated in said first stage adders, are expletive with respect to the combinations which some of said second stage adders must generate, and, the said some adders of said second stage receive such expletive word bits on other inputs thereof.

3. Device according to claim 1 wherein adders of said first stage, the outputs of which are each connected to inputs of more than one adder of said second stage, receive word bits which, in the subcombinations thus generated in said first stage adders, are expletive with respect to the combinations which some of such several adders must generate, and, such word bits are received by two adders of said first stage, the output subcombinations of which are applied to the same second stage adder for which the generated combination of such bits are expletive.

4. Device according to claim 1, wherein one of the adders of the first stage generates a word parity check bit from an exclusive-OR operation on the incoming byte parity bits and the output of said adder is connected to an input of at least one adder of the second state.

5. Device according to claim 1, wherein each adder of the first stage which generates a parity check bit receives, further to the bits of the concerned byte of the word, the incoming parity bit of said byte.

* * * * *